(12) United States Patent
Nguyen et al.

(10) Patent No.: US 6,609,632 B2
(45) Date of Patent: Aug. 26, 2003

(54) REMOVABLE LID AND FLOATING PIVOT

(75) Inventors: Tue Nguyen, Fremont, CA (US); Craig Alan Bercaw, Los Gatos, CA (US)

(73) Assignee: Simplus Systems Corporation, Fremont, CA (US)

( * ) Notice: Subject to any disclaimer, the term of this patent is extended or adjusted under 35 U.S.C. 154(b) by 118 days.

(21) Appl. No.: 09/764,605

(22) Filed: Jan. 17, 2001

(65) Prior Publication Data

US 2002/0092144 A1 Jul. 18, 2002

(51) Int. Cl.[7] ............................................. B65D 51/04
(52) U.S. Cl. ..................................................... 220/819
(58) Field of Search ...................... 438/14; 25/29.01; 134/32; 248/292.13; 74/97.1; 220/819; 414/277; 430/5.1

(56) References Cited

U.S. PATENT DOCUMENTS 6,050,446 A * 4/2000 Lei .............................. 220/819
6,145,397 A * 11/2000 Nzeadibe ..................... 74/97.1
6,395,101 B1 * 5/2002 Scranton ...................... 134/32

* cited by examiner

Primary Examiner—John F. Niebling
Assistant Examiner—Andre' C Stevenson
(74) Attorney, Agent, or Firm—Tue Nguyen

(57) ABSTRACT

A semiconductor processing system includes a chamber adapted to process a wafer, the chamber having an opening to facilitate access to the interior of the chamber. The system has a lid coupled to the chamber opening, the lid having an open position and a closed position. An actuator is connected to the lid to move the lid between the closed position and the open position. The system may include a floating pivot coupled to the lid and the actuator to align the lid with the opening when the lid closes.

12 Claims, 5 Drawing Sheets

REMOVABLE LID AND FLOATING PIVOT

BACKGROUND

This invention relates to apparatus and methods of providing an actuated lid for a process chamber.

In many semiconductor-manufacturing processes, substrates are processed in a series of one or more phases. For example, substrates can undergo a pre-heating phase during which the substrate is heated to an initial temperature before the substrate is loaded completely into a processing chamber and processed with a prescribed heating cycle. To achieve the required device performance, yield, and process repeatability, the processing of a substrate such as a semiconductor wafer is strictly controlled inside a process chamber.

Generally, a process chamber has a chamber body enclosing components of the process chamber. The process chamber typically maintains vacuum and provides a sealed environment for process gases during substrate processing. On occasions, the process chamber needs to be periodically accessed to cleanse the chamber and to remove unwanted materials cumulating in the chamber. To support maintenance for the process chamber, an opening is typically provided at the top of the process chamber that is sufficiently large to provide access to the internal components of the process chamber.

To support these conflicting requirements, a lid is used to help the process chamber to provide a sealed environment for the processing gases during substrate processing by mating with the process chamber and incorporating an elastomeric seal between the lid and the process chamber, and to allow access to the inner chamber. Typically, a lid provides access to the components inside the chamber, and shields the operator from exposure to high temperatures during system operation. The lid generally remains closed during most process steps unless the chamber is opened, for example, to perform a preventive maintenance chamber cleaning, thereby breaking the vacuum and bringing the chamber to atmospheric pressure. Certain lids are manually dismounted and removed from the chamber before the chamber can be accessed. In other cases, lid hinges connect the lids to the chambers, and these hinges typically include locking ratchets to prevent the lids from unintentional collapses or closures that can slam the lids into the chambers with great force.

Originally, the lids were small and were easily handled by operators. As the chamber size increases to handle larger substrates, the lids increase in size. At present, lids have become relatively heavy, making opening and closing of the lids relatively difficult. Further, when closing a large, heavy lid, it is difficult to properly align the lid to obtain a proper seal.

SUMMARY

In one aspect, a semiconductor processing system includes a chamber adapted to process a wafer, the chamber having an opening to facilitate access to the interior of the chamber. The system has a lid coupled to the chamber opening, the lid having an open position and a closed position. An actuator is connected to the lid to move the lid between the closed position and the open position. The system may optionally include a floating pivot coupled to the lid and the actuator to align the lid with the opening when the lid closes.

Implementations of the above aspect may include one or more of the following. A fixed pivot screw may be connected to the lid and the actuator. A guide link may be connected to the fixed pivot screw. A load link can be connected to the floating pivot screw. A guide shaft can be rotatably connected to the load link. The system also includes a drive pivot positioned at one end of the load link, and a rod extending from the actuator to the drive pivot can drive the lid. A support bracket can be provided to mount the actuator to the chamber body. The actuator can be air actuated or (hydraulically) actuated. Alternatively, the actuator can be motorized.

In another aspect, a floating pivot to automatically align a lid to a body of a semiconductor processing chamber includes a load link having first and second portions; a flanged bearing positioned between the first and second portions of the bearing; and a self-centering spring positioned around the perimeter of the bearing.

Implementations of the above aspect may include one or more of the following. The pivot can include a tension shim positioned between the load link and the bearing.

A pivot screw can be used to tighten the bearing. The self-centering spring can be an O-ring, leaf springs, coil springs, or any combinations thereof. A lid can be connected to a first end of the load link. A chamber body can be connected to a second end of the load link. The self-centering spring can be an elastomeric separator. The self-centering spring allows radial movements, axial movements, or both radial and axial movements. The self-centering spring also allows self-centering of the lid to the chamber body.

Advantages of the system may include one or more of the following. The system provides a removable lid that covers and seals an opening in the chamber when closed. The lid can also be selectively opened to provide access to the interior of the process chamber so that components inside the chamber may be removed for cleaning, repair or maintenance. When closed, the lid is properly aligned relative to the other processing components to facilitate repeatability and accuracy of the process.

The system supports a variety of instrumentation and devices on top of the lid while maintaining a small footprint by integrating more components onto the lid. The system operates even when the lid components cause the lid center of mass to be shifted or cantilevered behind the chamber without suffering from misalignment problems. Further, the lid with components mounted on top of the lid is easy to use, simple to assemble, reliable and inexpensive.

Other features and advantages will become apparent from the following description, including the drawings and the claims.

DESCRIPTION

Figure 1A:
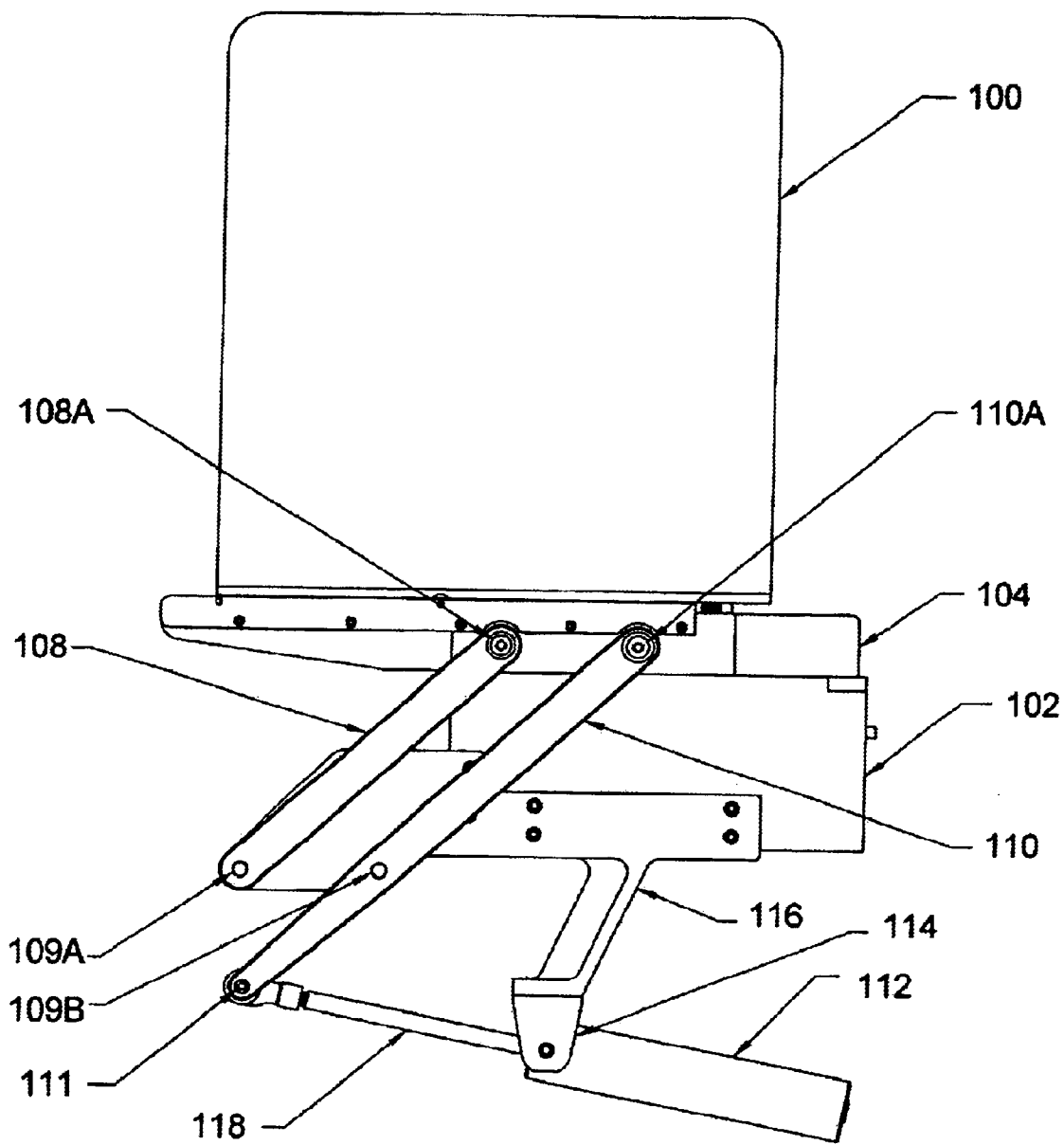
FIG. 1A shows a cross sectional view of one embodiment of an actuated lid assembly in a closed position.
Figure 1B:
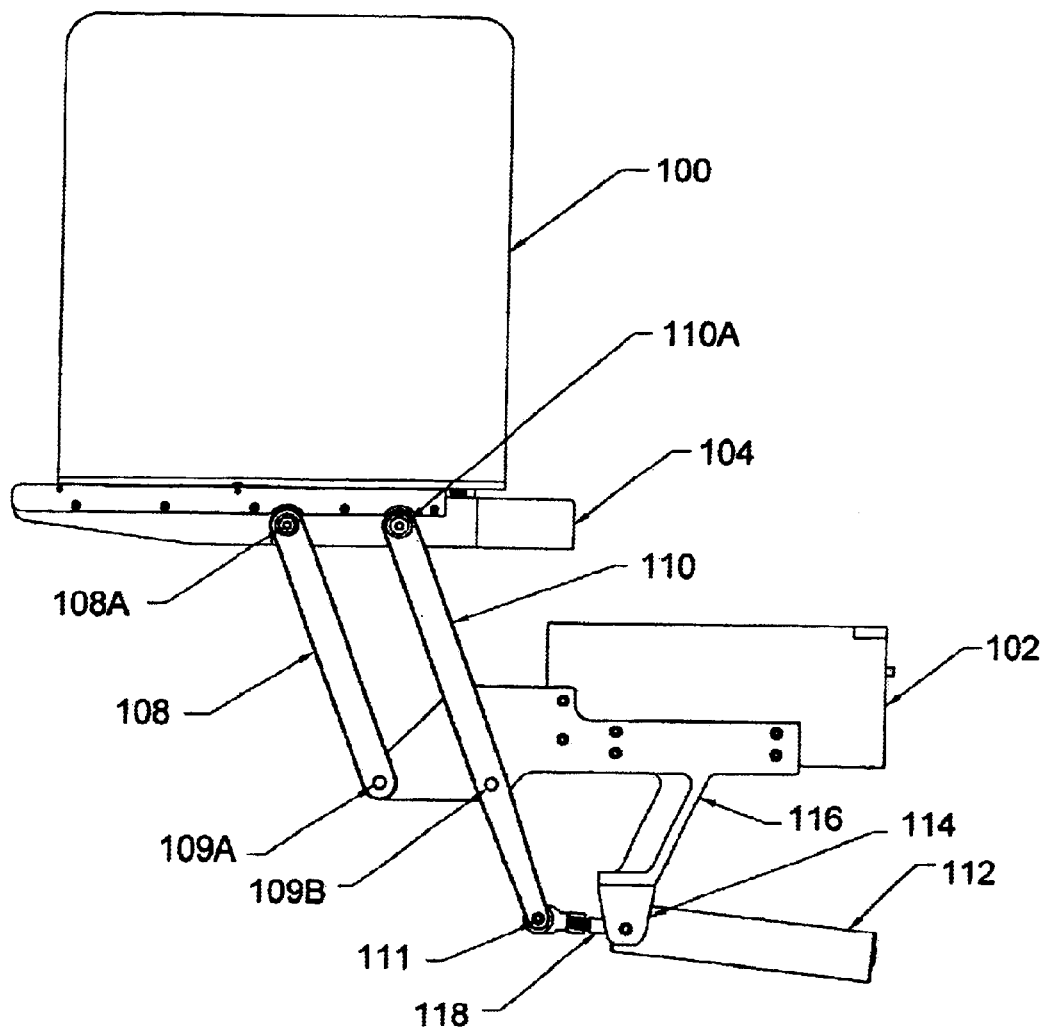
FIG. 1B shows the assembly of FIG. 1A in its open position.

FIG. 1A shows an actuated lid assembly 100 in a closed position, while FIG. 1B shows the assembly 100 in its open position. Referring now to FIGS. 1A–1B, a chamber body 102 is adapted to receive a wafer for processing. The chamber body 102 is selectively sealed through a chamber lid 104. Further, each side of the lid 104 is rotatably connected to a guide link 108 through a fixed pivot screw assembly 108A. Each side of the lid 104 is also rotatably connected to a load link 110 through a floating pivot screw assembly 110A. The floating pivot screw assembly 110A is shown in more detail in FIG. 2. The guide link 108 and the load link 110 pivotably move about guide shafts 109A and 109B.

The load link 110 is connected to a cylinder rod 118 at a drive pivot 111. An air cylinder 112 actuates cylinder rod 118. The air cylinder 112 is connected to a support bracket 116 through a trunnion 114. The support bracket 116 in turn is attached to the chamber body 102. Although the cylinder 112 is used in the embodiment of FIGS. 1A–1B, a variety of driving mechanisms such as a hydraulic cylinder, a controllable motor or equivalent can be used. For example, a stepper motor and a suitable gear drive can move the lid in controlled increments between the open and closed positions.

To move from the open position to the closed position, the air cylinder 112 is depressurized, causing the cylinder rod 118 to extend and driving the drive pivot 111. The drive pivot 111 then applies rotational force to be directed against the drive shaft, causing it to pivot. This forces the chamber lid 104 and guide link 108 to rotate about the guide shafts 109A and 109B, causing the lid 104 to close. As lid closes, alignment is maintained between the chamber lid 104 and chamber 102 to effect a vacuum seal.

FIG. 1B shows the lid assembly 100 in its open position. To move from the closed position to the open position, the air cylinder 112 is pressurized, causing the cylinder rod 118 to contract and driving the drive pivot 111. The drive pivot 111 then applies rotational force to be directed against the drive shaft, causing it to pivot. This forces the chamber lid 104 and guide link 108 to rotate about the guide shafts 109A and 109B, causing the lid 104 to open.

Figure 2:
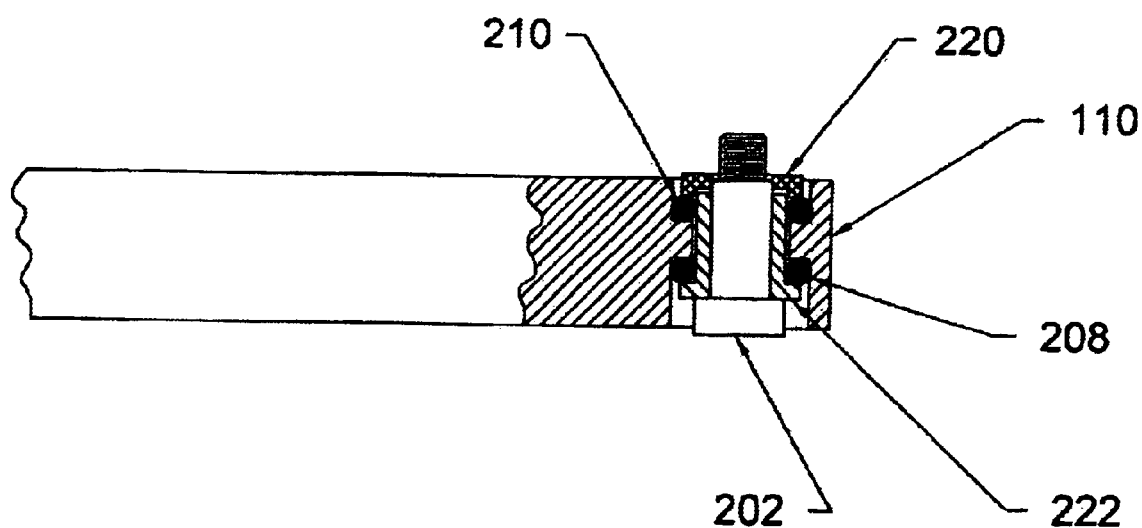
FIG. 2 shows a cross sectional view of the floating pivot.

FIG. 2 shows a floating pivot that allows the lid 104 and the chamber body 102 to be aligned. The floating pivot of FIG. 2 has a plain bearing 222 with a flange positioned between a first portion of the load link 110 and a second portion of the load link 110. The bearing 222 is secured to the first and second portions of the load link 110 through a pivot screw 202 and one or more tension shims 220.

The pivot axis about which load link 110 arm rotates is allowed some degree of freedom through a self-centering spring. In this embodiment, the self-centering spring includes two elastomeric separators 208 and 210. In one embodiment, the elastomeric separators 208–210 are O-rings that center the plain bearing 222 with the flange inside a housing inside the load link 110. The O-ring plain bearing 222 is located near the O-rings 208–210, and due to the O-ring 208–210's elastic property, the bearing 222 is allowed to be displaced laterally around the axis of rotation some small amount to accommodate alignment between the chamber lid 104 and the chamber body 102 as the lid 104 closes. The elastomeric material includes physical characteristics permitting the first and second portions of the load link 110 to rotate and shift laterally with respect to each other. The elastic property of the elastomeric separators 208–210, in this case the O-rings, serves as a "self centering spring" acting about the pivot axis. This allows the pivot axis to "float", thereby providing a self-alignment and self-centering feature between the chamber body 102 and the lid 104. Further, the one or more elastomeric separators allow radial movements, axial movements, or both radial and axial movements, in addition to supporting self-centering. The "self centering spring" is not necessarily limited to an elastomer or an "o-ring". Any number of "self centering spring" designs could be implemented to perform the same function as the elastomeric "o-rings. For example, a plurality of leaf or coil springs could be arrayed radially about the longitudinal axis of the pivot screw 202 and used in either tension or compression to perform the same function as the elastomeric o-rings.

The elastomeric material is a rubber-like material having broad performance characteristics over a wide temperature range. Materials that will perform under these conditions will be, for example, but not limited to, polyether polyurethanes, polyester polyurethanes, rubbers, thermoplastic urethanes, thermoplastic elastomers, any copolymer of these or other materials, and any other such elastomeric material that can be cast, compression molded, injection molded, extruded or any other type of manufacturing process. The materials may also use a form of reinforcing such as, but not limited to, fibers, cloths, or fillers.

Due to the physical characteristics of the elastomeric material, the load link 110 can now pivot on a floating pivot axis. In other words, the opposite first and second sides of the elastomeric material can shift laterally and rotate simultaneously with respect to each other during pivoting of the load link 110.

Figure 3:
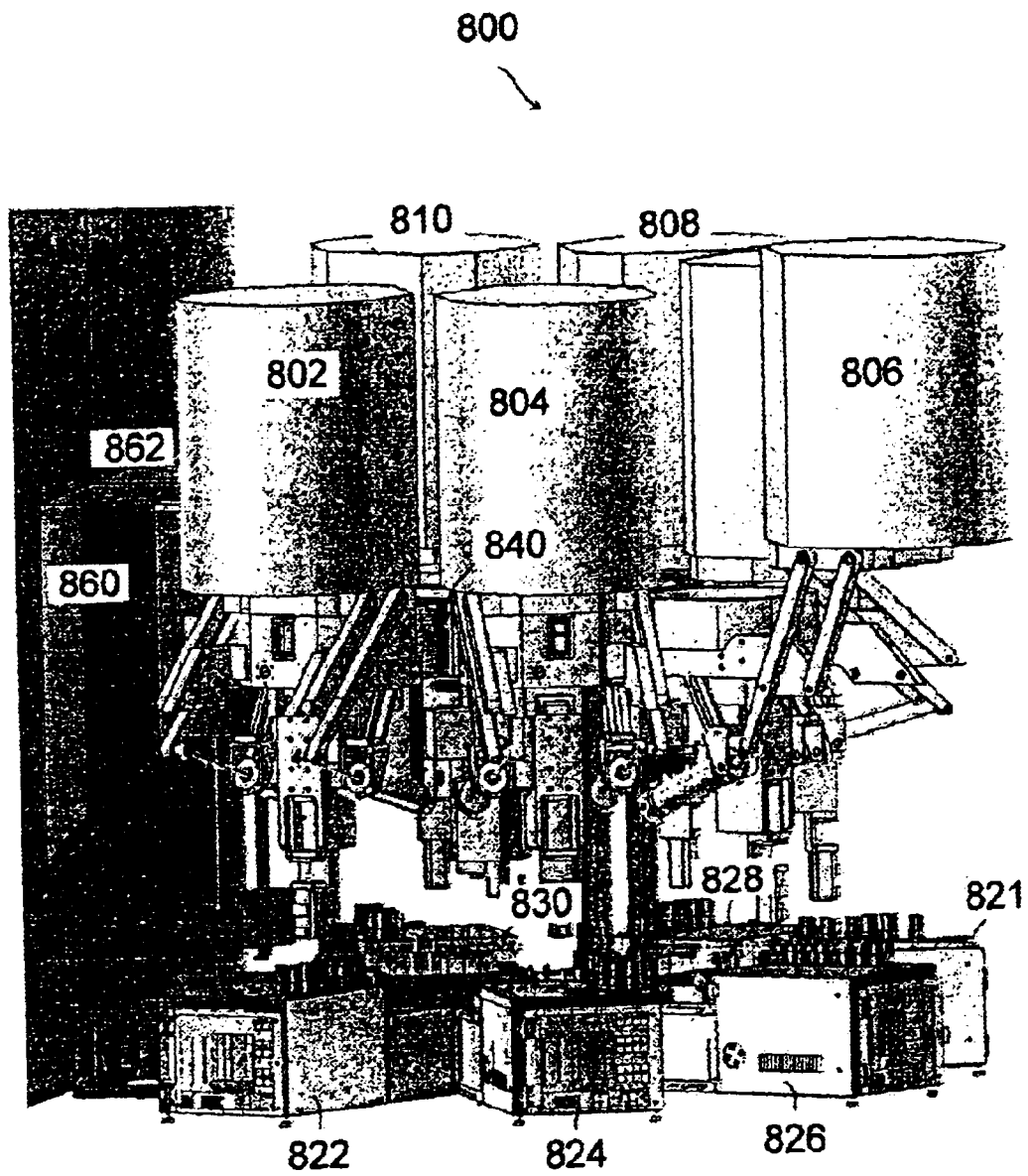
FIG. 3 shows a multi-chamber wafer processing system.

Referring now to FIG. 3, a multi-chamber semiconductor processing system 800 is shown. The processing system 800 has a plurality of chambers 802, 804, 806, 808 and 810 adapted to receive and process wafers 842. Controllers 822, 824, 826, 828 and 830 control each of the chambers 802, 804, 808 and 810, respectively. Additionally, a controller 821 controls another chamber, which is not shown for illustrative purposes.

Each of chambers 802–810 provides a lid 104 on the chamber body 102. During maintenance operations, the lid 104 can be actuated into the open position so that components inside the chamber body 102 can be readily accessed for cleaning or replacement as needed.

The chambers 802–810 are connected to a transfer chamber 840 that receives a wafer (not shown). The wafer rests on top of a robot blade or arm (not shown). The robot blade receives the wafer from an outside processing area.

The transport of wafers between processing areas entails passing the wafers through one or more doors separating the areas. The doors can be load lock chambers 860–862 for passing a wafer-containing container or wafer boat that can hold about twenty-five wafers in one embodiment. The wafers are transported in the container through the chamber from one area to another area. The load lock can also provide an air circulation and filtration system that effectively flushes the ambient air surrounding the wafers.

Each load lock chamber 860 or 862 is positioned between sealed openings, and provides the ability to transfer semiconductor wafers between fabrication areas. The load locks 860–862 can include an air circulation and filtration system that effectively flushes the ambient air surrounding the wafers. The air within each load lock chamber 860 or 862 can also be purged during wafer transfer operations, significantly reducing the number of airborne contaminants transferred from one fabrication area into the other. The load lock chambers 860–862 can also include pressure sensors that take air pressure measurements for control purposes.

During operation, a wafer cassette on a wafer boat is loaded at openings in front of the system to a load lock through the load lock doors. The doors are closed, and the system is evacuated to a pressure as measured by the pressure sensors. A slit valve (not shown) is opened to allow the wafer to be transported from the load lock into the transfer chamber. The robot blade takes the wafer and delivers the wafer to an appropriate chamber. A second slit valve opens between the transfer chamber and process chamber, and wafer is brought inside the process chamber.

Containers thus remain within their respective fabrication areas during wafer transfer operations, and any contaminants clinging to containers are not transferred with the wafers from one fabrication area into the other. In addition, the air within the transfer chamber can be purged during wafer transfer operations, significantly reducing the number of airborne contaminants transferred from one fabrication area into the other. Thus during operation, the transfer chamber provides a high level of isolation between fabrication stations.

Figure 4:
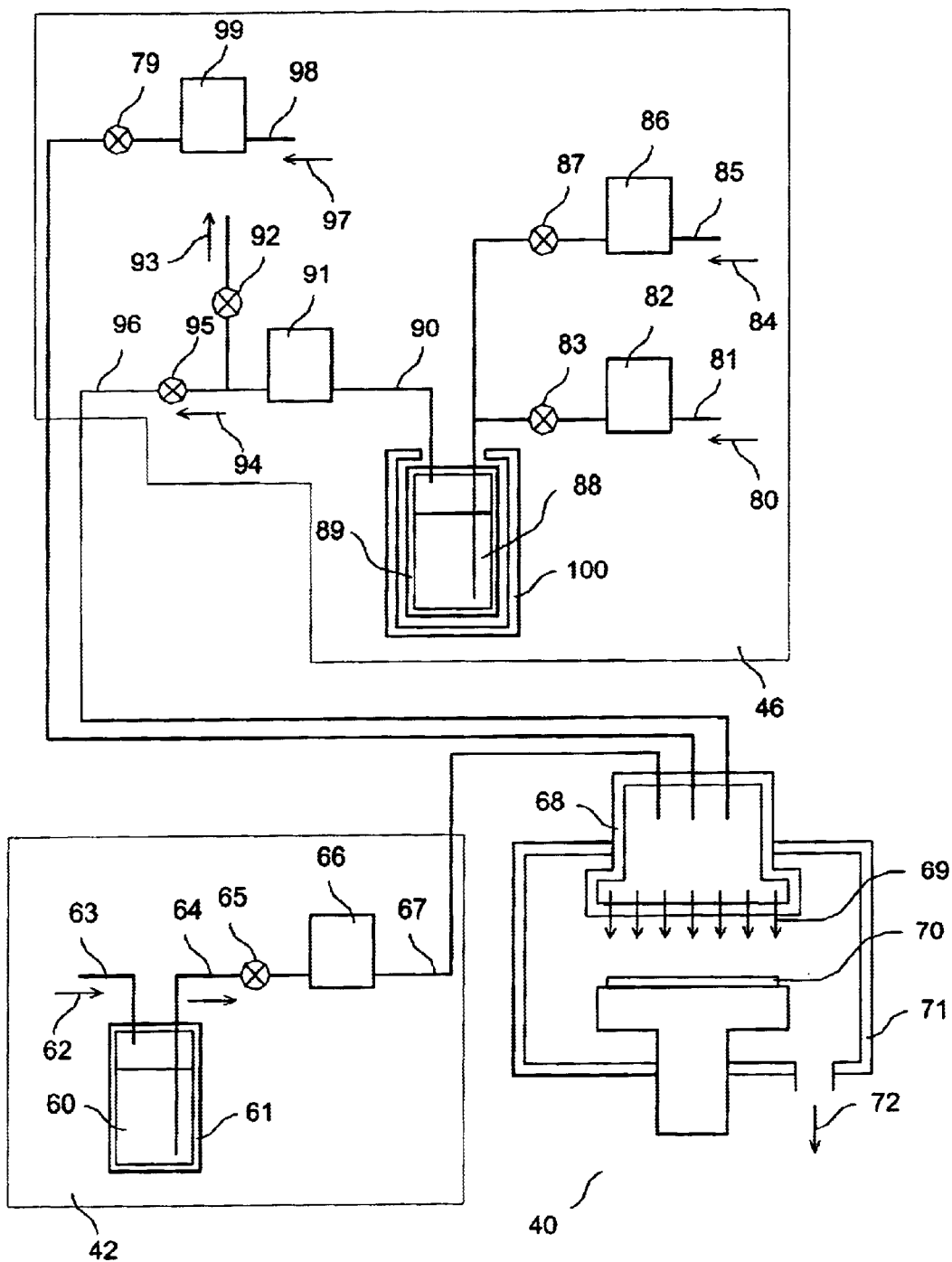
FIG. 4 shows an exemplary a system for delivering for liquid and vapor precursors having an actuated lid.

FIG. 4 shows an exemplary an apparatus 40 for liquid and vapor precursor delivery using the system 100. The apparatus 40 includes a chamber 44 such as a CVD chamber. The chamber 40 includes a chamber body 102 that defines an evacuable enclosure for carrying out substrate processing. The chamber body 102 has an opening that is covered by the actuated lid 104. During operation, the lid 104 is in its closed position to seal the chamber body 102 from ambient environment. For maintenance purposes, the lid 104 can be actuated into the open position so that components inside the chamber body 102 can be readily accessed for cleaning or replacement as needed.

The chamber body has a plurality of ports including at least a substrate entry port that is selectively sealed by a slit valve and a side port through which a substrate support member can move. The apparatus 40 also includes a vapor precursor injector 46 connected to the chamber 44 and a liquid precursor injector 42 connected to the chamber 40.

In the liquid precursor injector 42, a precursor 60 is placed in a sealed container 61. An inert gas 62, such as argon, is injected into the container 61 through a tube 63 to increase the pressure in the container 61 to cause the copper precursor 60 to flow through a tube 64 when a valve 65 is opened. The liquid precursor 60 is metered by a liquid mass flow controller 66 and flows into a tube 67 and into a vaporizer 68, which is attached to the CVD chamber 71. The vaporizer 68 heats the liquid causing the precursor 60 to vaporize into a gas 69 and flow over a substrate 70, which is heated to an appropriate temperature by a susceptor to cause the copper precursor 60 to decompose and deposit a copper layer on the substrate 70. The CVD chamber 71 is sealed from the atmosphere with exhaust pumping 72 and allows the deposition to occur in a controlled partial vacuum.

In the vapor precursor injector 46, a liquid precursor 88 is contained in a sealed container 89 which is surrounded by a temperature controlled jacket 100 and allows the precursor temperature to be controlled to within 0.1° C. A thermocouple (not shown) is immersed in the precursor 88 and an electronic control circuit (not shown) controls the temperature of the jacket 100, which controls the temperature of the liquid precursor and thereby controls the precursor vapor pressure. The liquid precursor can be either heated or cooled to provide the proper vapor pressure required for a particular deposition process. A carrier gas 80 is allowed to flow through a gas mass flow controller 82 when valve 83 and either valve 92 or valve 95 but not both are opened. Also shown is one or more additional gas mass flow controllers 86 to allow additional gases 84 to also flow when valve 87 is opened, if desired. Additional gases 97 can also be injected into the vaporizer 68 through an inlet tube attached to valve 79, which is attached to a gas mass flow controller 99. Depending on its vapor pressure, a certain amount of precursor 88 will be carried by the carrier gases 80 and 84, and exhausted through tube 93 when valve 92 is open.

After the substrate has been placed into the CVD chamber 71, it is heated by a heater. After the substrate has reached an appropriate temperature, valve 92 is closed and valve 95 is opened allowing the carrier gases 80 and 84 and the precursor vapor to enter the vaporizer 68 through the attached tube 96 attached tube 96. Such a valve arrangement prevents a burst of vapor into the chamber 71. The precursor 88 is already a vapor and the vaporizer is only used as a showerhead to evenly distribute the precursor vapor over the substrate 70. After a predetermined time, depending on the deposition rate of the copper and the thickness required for the initial copper deposition, valve 95 is closed and valve 92 is opened. The flow rate of the carrier gas can be accurately controlled to as little as 1 sccm per minute and the vapor pressure of the precursor can be reduced to a fraction of an atmosphere by cooling the precursor 88. Such an arrangement allows for accurately controlling the copper deposition rate to less than 10 angstroms per minute if so desired. Upon completion of the deposition of the initial copper layer, the liquid source delivery system can be activated and further deposition can proceed at a more rapid rate.

The present invention has been described in terms of several embodiments. The invention, however, is not limited to the embodiment depicted and described. For instance, the radiation source can be a radio frequency heater rather than a lamp. Hence, the scope of the invention is defined by the appended claims.

What is claimed is:

1. A floating pivot to automatically align two objects, comprising:
   a load link having first and second portions;
   a bearing positioned between the first and second portions of the load link; and
   a self-centering spring coupled to the perimeter of the bearing, the self-centering spring comprising leaf springs.

2. An apparatus as in claim 1, wherein the self-centering spring further comprises leaf and coil springs, O-rings, and leaf springs or O-rings and coil springs.

3. A semiconductor processing system, comprising:
   a chamber adapted to process a wafer, the chamber having an opening to facilitate access to the interior of the chamber;
   a lid coupled to the chamber opening, the lid having an open position and a closed position;
   an actuator coupled to the lid to move the lid between the closed position and the open position; and
   a floating pivot coupled to the lid and the actuator to align the lid with the opening when the lid closes, the floating pivot comprising
   a load link having first and second portions;
   a bearing positioned between the first and second portions of the load link; and
   a self-centering spring coupled to the perimeter of the bearing, the self-centering spring comprising leaf springs.

4. The system of claim 3, further comprising a fixed pivot coupled to the lid and the actuator.

5. The system of claim 4, further comprising a guide link coupled to the fixed pivot.

6. The system of claim 3, further comprising a guide shaft rotatably coupled to the load link.

7. The system of claim 3, further comprising a drive pivot positioned at one end of the load link.

8. The system of claim 7, further comprising a rod extending from the actuator coupled to the drive pivot to move the lid.

9. The system of claim 3, further comprising a support bracket coupled to the actuator and the chamber body.

10. The system of claim 3, wherein the actuator is air actuated or hydraulically actuated.

11. The system of claim 3, wherein the actuator is motorized.

12. A semiconductor processing system, comprising:
- a chamber adapted to process a wafer, the chamber having an opening to facilitate access to the interior of the chamber;
- a lid coupled to the chamber opening, the lid having an open position and a closed position, the open and closed positions being moved horizontally in a substantially parallel manner relative to the opening;
- an actuator coupled to the lid to move the lid between the closed position and the open position; and
- a floating pivot coupled to the lid and the actuator to align the lid with the opening when the lid closes, the floating pivot comprising
  - a load link having first and second portions;
  - a bearing positioned between the first and second portions of the load link; and
  - a self-centering spring coupled to the perimeter of the bearing, the self-centering spring comprising leaf springs.

* * * * *